United States Patent [19]
Mariuz et al.

[11] Patent Number: 5,523,756
[45] Date of Patent: Jun. 4, 1996

[54] ANALOG-TO-DIGITAL CONVERTER WITH OFFSET REDUCTION LOOP

[75] Inventors: Stephen D. Mariuz; Eric Foasberg, both of Grass Valley, Calif.

[73] Assignee: The Grass Valley Group, Inc., Nevada City, Calif.

[21] Appl. No.: 182,469

[22] Filed: Jan. 18, 1994

[51] Int. Cl.$^6$ .............................. H03M 1/12; H03M 1/06
[52] U.S. Cl. ............................................ 341/118; 341/155
[58] Field of Search ...................................... 341/118, 120, 341/155

[56] References Cited

U.S. PATENT DOCUMENTS

| | | | |
|---|---|---|---|
| 4,097,860 | 6/1978 | Araseki et al. | 341/118 |
| 4,380,005 | 4/1983 | Debord et al. | 340/347 AD |
| 4,590,458 | 5/1986 | Evans et al. | 340/347 AD |
| 4,602,374 | 7/1986 | Nakamura et al. | 375/17 |
| 4,766,417 | 8/1988 | Takayama et al. | 340/347 CC |
| 4,805,192 | 2/1989 | Confalonieri et al. | 375/25 |
| 4,963,872 | 10/1990 | Schneider et al. | 341/118 |
| 4,965,867 | 10/1990 | Tsuchida et al. | 341/118 |
| 4,972,189 | 11/1990 | Polito et al. | 341/118 |
| 4,982,191 | 1/1991 | Ohta | 341/118 |
| 4,996,529 | 2/1991 | Connell et al. | 341/118 |
| 5,084,700 | 1/1992 | Christopher et al. | 341/118 |
| 5,146,223 | 9/1992 | Muto et al. | 341/118 |
| 5,200,752 | 4/1993 | Goeke | 341/168 |
| 5,204,677 | 4/1993 | Akagirl | 341/118 |

*Primary Examiner*—Howard L. Williams
*Attorney, Agent, or Firm*—Francis I. Gray

[57] ABSTRACT

An analog-to-digital converter with an offset reduction loop detects the presence/absence of an analog input signal having a zero mean value. The analog input signal is converted to a digital signal by the analog-to-digital converter. The least significant bits of the digital signal are compared with a decision threshold to generate an indicator signal representing the presence/absence of the analog input signal. Arbitrary d.c. offsets in the digital signal are compensated by generating a d.c. offset compensation signal from the most significant bit of the digital signal with respect to a mid-logic reference voltage. The d.c. offset compensation signal is added to the analog input signal prior to conversion to the digital signal.

12 Claims, 1 Drawing Sheet

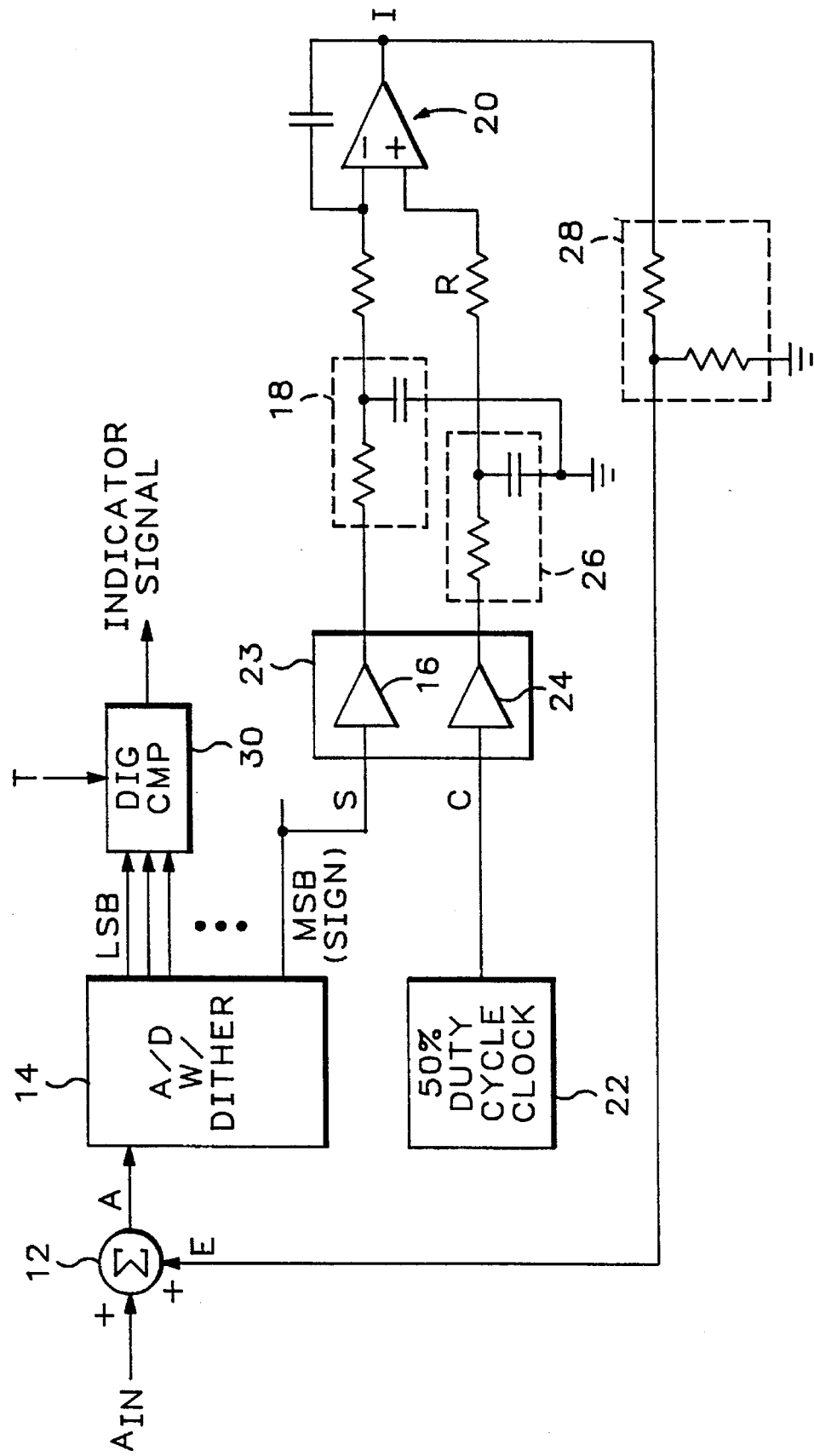

ANALOG-TO-DIGITAL CONVERTER WITH OFFSET REDUCTION LOOP

BACKGROUND OF THE INVENTION

The present invention relates to analog-to-digital converters, and more particularly to the use of an analog-to-digital converter with an offset reduction loop for detecting the presence/absence of an analog signal.

The detection of the presence/absence of analog signals is generally performed by rectifying and peak detecting an analog input signal to produce a d.c. signal. The d.c. signal is compared with a threshold value, and from the comparison the presence of the analog signal is detected. If there is no analog signal, the threshold is not exceeded, and vice versa.

Many analog signals, such as audio signals, represent zero mean value processes, i.e., over an extended period of time the direct current (d.c.) component is zero. The analog-to-digital conversion of a zero mean value signal should yield a digital signal which does not exhibit a static d.c. offset when reconstituted to analog form. This is not always true due to internal or external offsets. The sign bit of the analog-to-digital conversion output should represent the polarity of an analog sample from the analog input signal. A zero mean value input signal should yield equal numbers of positive and negative (logical 1 and 0) sign bits on average.

Examples of offset compensation circuits are shown in U.S. Pat. No. 4,965,867, issued Oct. 23, 1990 to Tsuchida et. al. entitled "Offset Compensation Circuit", and U.S. Pat. No. 4,996,529, issued Feb. 26, 1991 to Connell entitled "Auto-Zeroing Circuit for Offset Cancellation." In Tsuchida et. al. a sign bit from an ADC is integrated to generate a compensation voltage which is used to control an input filter to equalize the probability that the polarities of the sign bit are equal to each other. Connell also uses an integrator in a feedback loop to determine when the inequality of polarities of the sign bit exceeds an overflow threshold, and then provides a bias control signal that is attenuated and applied to an input limiter.

SUMMARY OF THE INVENTION

The present invention provides an analog-to-digital converter with an offset reduction loop for detecting the presence/absence of an analog input signal. A d.c. offset compensation signal is added to the analog input signal, and the compensated analog input signal is input to an analog-to-digital converter (ADC). The least significant bits from the ADC are compared with a decision threshold value to determine the presence/absence of the analog input signal. To compensate for arbitrary d.c. offsets in the output from the ADC, the sign bit is integrated with respect to a reference voltage that represents a mid-logic level. The reference voltage is generated from a precision 50% duty cycle clock signal. The output from the integrator is attenuated to produce the d.c. offset compensation signal.

The objects, advantages and other novel features of the present invention are apparent from the following detailed description when read in conjunction with the appended claims and attached drawing.

BRIEF DESCRIPTION OF THE DRAWING

The FIGURE is a block diagram view of an analog-to-digital converter with an offset reduction loop according to the present invention.

DESCRIPTION OF THE PREFERRED EMBODIMENT

Referring now to the FIGURE an analog input signal Ain is input to a summing circuit 12 together with a d.c. offset compensation signal E. The resulting analog signal A is input to an analog-to-digital converter (ADC) 14 which includes an internal dither generator, such as the Analog Devices 1879 manufactured by Analog Devices, Inc. of Norwood, Mass., United States of America, which assures that there is always sign bit activity even with no analog input signal. The output from the ADC 14 is a digital version of the analog signal A. The most significant bit (MSB) from the ADC 14 is a sign bit S. The sign bit S is passed through a logic buffer gate 16, and is pre-filtered by an RC network 18 before being applied as one input to an integrator 20 to compensate for non-ideal integrator characteristics and enhance a desired low frequency component. A precision 50% duty cycle clock generator 22 provides a clock signal C having a frequency low enough so that edge effects are minimal relative to the clock period, and so that a clock divider chain yields a precision 50% duty cycle. The clock signal also is passed through a logic buffer gate 24 which is on the same substrate 23 as the sign bit logic buffer gate 16 to ensure that the logic levels of the two signals track over time and temperature. The clock signal C is lowpass filtered with a simple RC network 26 to yield a mid-logic level integrator reference voltage R for input to the integrator 20. The integrator output I is input to a resistive attenuator 28, the output of which is the d.c. offset compensation signal E that is input to the summing circuit 12.

The least significant bits from the ADC 14 are input to a digital comparator circuit 30 where the bits are compared with a decision threshold value T. The integration of the pre-filtered sign bit S with the reference signal R to produce the d.c. offset compensation signal E compensates for any arbitrary offset that exists in the analog input signal or the ADC 14 so that the decision threshold T may be fixed and repeatable. The presence of an analog input signal Ain provides digital values in the least significant bits that exceed the decision threshold T to generate an indicator signal, provided that the decision threshold T is above the noise output level of the ADC 14. If the decision threshold is not exceeded, then the absence of the analog input signal Ain is indicated. The indicator signal may be used to illuminate a light emitting diode (LED) or LED array to provide a visual indication of the presence/absence of the analog input signal Ain.

Thus the present invention provides an analog-to-digital converter with an offset reduction loop for detecting the presence/absence of an analog input signal by comparing the least significant bits from the analog-to-digital converter with a decision threshold value, and compensating for any d.c. offset by integrating the pre-filtered sign bit from the ADC with respect to a mid-logic reference voltage to generate a d.c. offset compensation signal which is added to the analog input signal prior to the ADC.

What is claimed is:
1. An apparatus for detecting the presence/absence of an analog input signal comprising:
   means for converting the analog input signal to a digital signal having a most significant bit and having least significant bits;
   means for comparing the least significant bits with a decision threshold value to generate an indicator signal representative of the presence/absence of the analog input signal; and means for compensating, as a function of the most significant bit and a mid-logic reference voltage, the analog input signal for arbitrary d.c. offsets in the digital signal.

2. The apparatus as recited in claim 1 wherein the compensating means comprises:

means for generating a d.c. offset compensation signal from the most significant bit and the mid-logic reference voltage; and means for adding the d.c. offset compensation signal to the analog input signal prior to input to the converting means.

3. The apparatus as recited in claim 2 wherein the generating means comprises:

means for generating the mid-logic reference voltage; and means for integrating the most significant bit with respect to the mid-logic reference voltage to generate the d.c. offset compensation signal.

4. The apparatus as recited in claim 3 wherein the d.c. offset compensation signal generating means further includes means for attenuating the d.c. offset compensation signal prior to input to the adding means.

5. The apparatus as recited in claim 3 wherein the mid-logic reference voltage generating means comprises:

a precision 50% duty cycle clock generator that produces a clock signal having amplitudes equal to logic "one" and "zero" levels and having a frequency low enough so that edge effects of the clock signal are minimal relative to the clock period; and means for filtering the clock signal to produce the mid-logic reference voltage.

6. The apparatus as recited in claim 5 wherein the filtering means comprises a lowpass filter having the clock signal as an input and the mid-logic reference voltage as an output.

7. The apparatus as recited in claim 3 wherein the d.c. offset compensation signal generating means further comprises means for pre-filtering the most significant bit prior to input to the integrating means.

8. A method of determining the presence/absence of an analog input signal comprising the steps of:

converting the analog input signal to a digital signal having a most significant bit and having least significant bits;

comparing the least significant bits with a decision threshold value to produce an indicator signal representing the presence/absence of the analog input signal; and compensating, as a function of the most significant bit and a mid-logic reference voltage, the analog input signal for arbitrary d.c. offsets in the digital signal.

9. The method as recited in claim 8 wherein the compensating step comprises the steps of:

integrating the most significant bit with respect to the mid-logic reference voltage to generate a d.c. offset compensation signal; and adding the d.c. offset compensation signal to the analog input signal prior to the converting step.

10. The method as recited in claim 9 wherein the compensating step further comprises the steps of:

generating a precision 50% duty cycle clock signal; and filtering the clock signal to produce the mid-logic reference voltage.

11. The method as recited in claim 9 wherein the compensating step further comprises the step of pre-filtering the most significant bit prior to the integrating step.

12. The method as recited in claim 9 wherein the compensating step further comprises the step of attenuating the d.c. offset compensation signal from the integrating step prior to the adding step.

* * * * *